United States Patent [19]

Brooks et al.

[11] 4,082,415
[45] Apr. 4, 1978

[54] HOLOGRAPHIC LENS ARRAY AND METHOD FOR MAKING THE SAME

[75] Inventors: Robert Ellison Brooks; Donald Charles Winter, both of Manhattan Beach, Calif.

[73] Assignee: TRW Inc., Redondo Beach, Calif.

[21] Appl. No.: 691,700

[22] Filed: Jun. 1, 1976

Related U.S. Application Data

[63] Continuation-in-part of Ser. No. 455,413, Mar. 27, 1974, abandoned.

[51] Int. Cl.² ............................................. G02B 27/00
[52] U.S. Cl. ............................................. 350/3.83
[58] Field of Search ........................................ 350/3.5

[56] References Cited
U.S. PATENT DOCUMENTS

| B 453,067 | 3/1976 | Kiemle | 350/3.5 X |
|---|---|---|---|
| 3,405,614 | 10/1968 | Lin et al. | 350/3.5 |
| 3,435,244 | 3/1969 | Burckhardt et al. | 350/3.5 X |
| 3,530,442 | 9/1970 | Collier et al. | 350/3.5 |
| 3,658,403 | 4/1972 | Greenaway et al. | 350/3.5 |
| 3,698,810 | 10/1972 | Bestenreiner et al. | 350/3.5 UX |
| 3,744,871 | 7/1973 | Takeda et al. | 350/3.5 |
| 3,752,555 | 8/1973 | Klotz | 350/3.5 |
| 3,836,224 | 9/1974 | Strehlow et al. | 350/3.5 |
| 3,941,450 | 3/1976 | Spitz et al. | 350/3.5 |

*Primary Examiner*—John K. Corbin
*Assistant Examiner*—John D. Lee
*Attorney, Agent, or Firm*—Fraser and Bogucki

[57] ABSTRACT

A novel hologram functioning as a multiple lenslet array of high density in which the lenslets have selected small spacings and relatively long focal lengths is disposed in a holographic data recording system to provide an object beam along a selected axis. Using the holographic lens array, a data hologram may be recorded with improved uniformity between data points, efficiency, hologram illumination, and with minimization of data beam blockage. In preparing the novel hologram, a coherent object beam may be used to define a plurality of sources for simultaneous recording of a plurality of lenslets. The lenslets of a refractive precursor array defined by a commercially available fly's eye lens may be illuminated simultaneously, and selected size, shape, spacing and f-number characteristics for the lenslets may be achieved by concurrent optical transformation of the individual beamlets before recording. The precursor array may advantageously be immersed in a surrounding fluid of controllable refractivity, to substantially increase the effective focal length at the precursor lenses, and enable a substantially larger area of each lenslet to be used.

12 Claims, 5 Drawing Figures

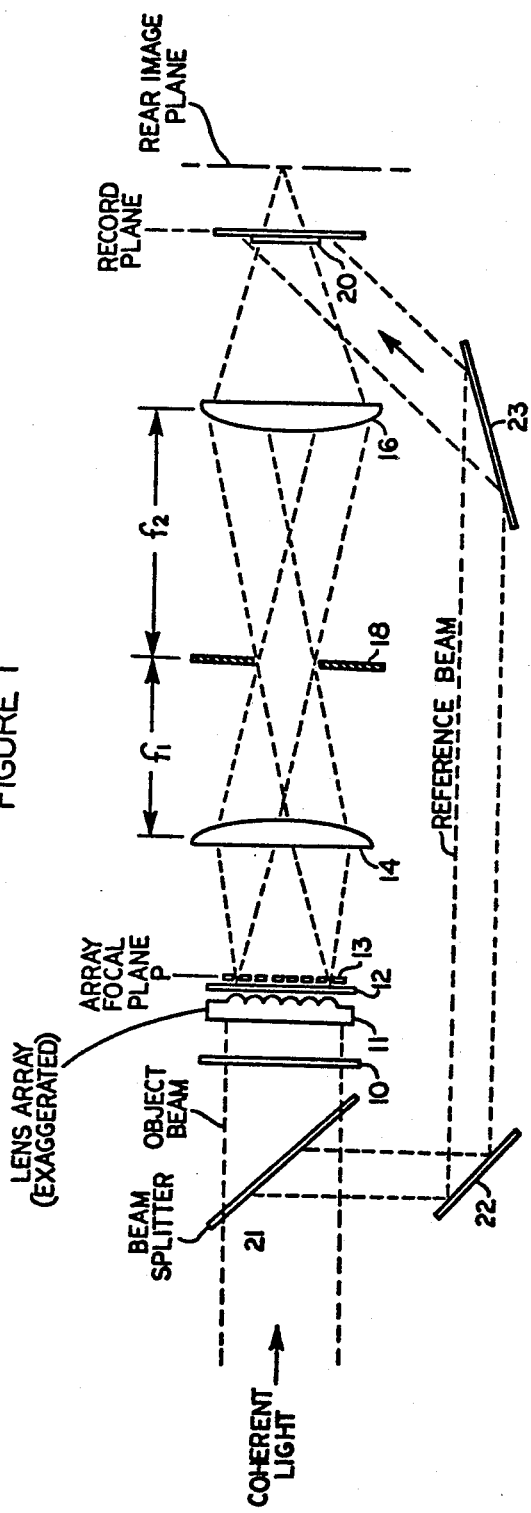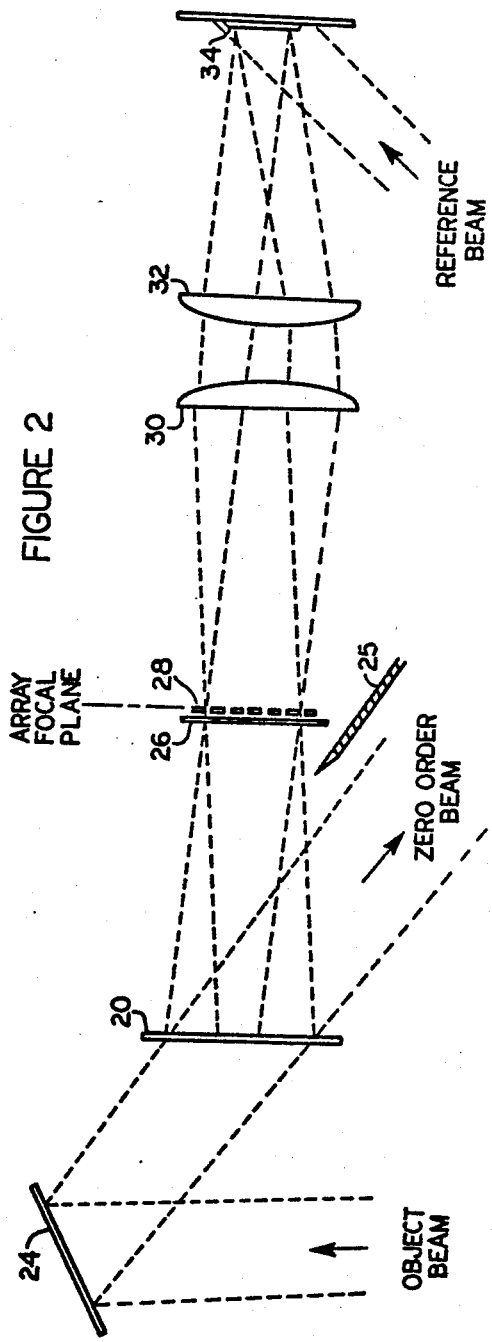

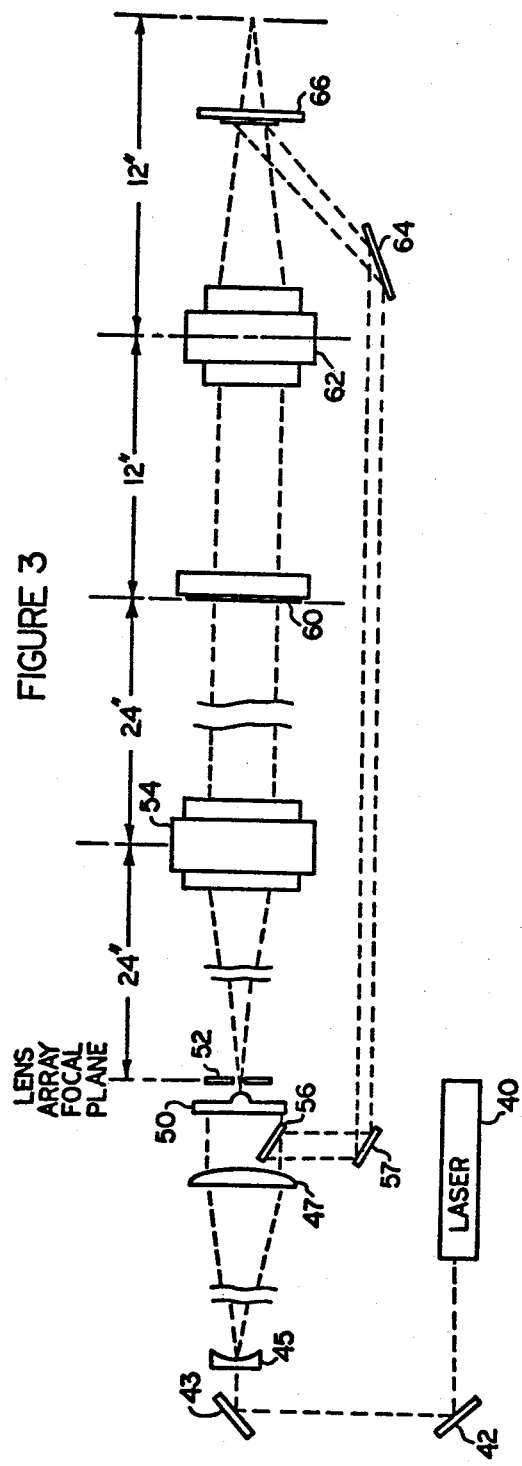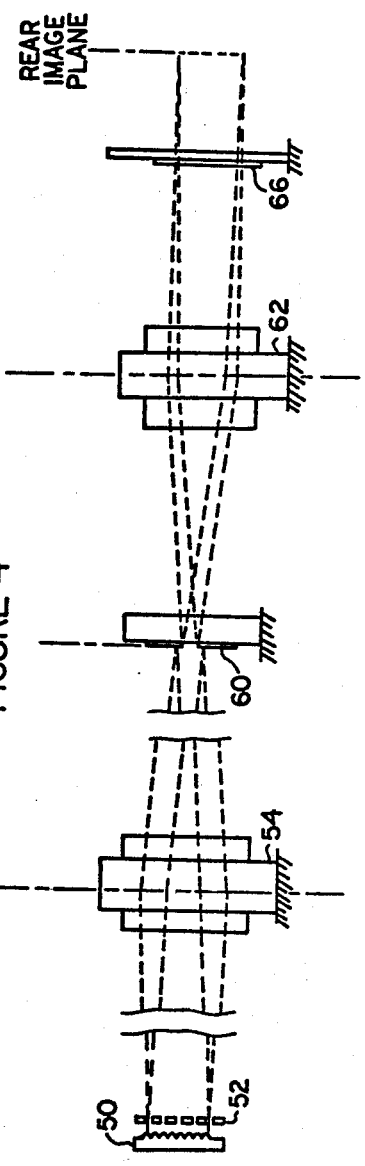

HOLOGRAPHIC LENS ARRAY AND METHOD FOR MAKING THE SAME

REFERENCE TO PRIOR APPLICATION

This application is a continuation-in-part of our previously filed application Ser. No. 455,413, filed Mar. 27, 1974, now abandoned.

BACKGROUND OF THE INVENTION

In the use of holography to record digital data, a number of systems employ arrays of lenslets, often referred to as "fly's eye lenses". Examples of these uses are found in U.S. Pat. Nos. 3,765,749, 3,533,673 and 3,716,287. In U.S. Pat. No. 3,765,749 two fly's eye lenses are described that have focal ratios given at $f/3.6$. The fly's eye lens of 3,533,673 constitutes an array of spherical lenslets, again of very small $f$- number although no specific number is given. U.S. Pat. No. 3,716,287, assigned to the assignee of the present invention, describes the use of such a lens in a particular type of data recorder in which an array of light modulators is used. In this system, a fly's eye lens is employed for focusing the beams from the modulator array in such fashion as to introduce phase randomization that averages out excessive intensity variations.

While the system of U.S. Pat. No. 3,716,287 has been constructed and operates fully satisfactorily as described, it is limited in efficiency by practical considerations. Commercially available lens arrays of non-prohibitive cost comprise, for example, embossed plastic elements having small $f$- numbers (e.g. $f/3$), and relatively good lens quality with adequate phase randomization between lenslets. Only by rare coincidence, however, would such an available lens meet the specifications for a particular holographic system, in which the number and spacing of elements and the $f$- number are determined by other considerations. Of course, the necessary tooling for making an array for a specific application can be manufactured, but at far greater cost. Even if arrays can be produced that have suitable numbers of lenslets with sufficiently small spacings between the lenslets, certain optical limitations cannot be avoided. Specifically, it is highly unlikely that high $f$- numbers can be supplied, that leakage between lenslets can be minimized without loss of intensity or that high optical efficiency can be achieved. In addition, pits, bubbles or other defects in the individual lenslets can render an entire array unsuitable for use.

In some systems it is known to utilize a light diverting or diffracting element in step and repeat fashion to successively record a number of holograms in a matrix pattern. Each of these holograms may thereafter be used for a comparable light diverting or diffracting function. In U.S. Pat. No. 3,744,871, for example, a successive recording technique is used for preparing what is termed an "ordinary-illumination hologram" for purposes of beam redirection when used in a light modulator system. While the description is not clear as to the mechanism involved, it is evident that a point diffraction technique is involved in deflecting the beam and that it is then brought down to a point for recording at each position. However, both the point diffraction and the point recording are particularly subject to the effects of impurities, grain defects, bubbles and other film and optical imperfections that inevitably are encountered, because such imperfections are relatively large in comparison to the small areas used. In addition the efficiency with which the light available for illumination is used is very low. Thus, this approach is far less than adequate for present day systems, in which each element of a high density matrix must meet high standards as to optical characteristics and signal-to-noise ratio. Furthermore, a hologram prepared in this manner requires additional optical elements in order to precisely illuminate each element of a light modulator array.

U.S. Pat. No. 3,941,450 contains a later teaching of the usage of a two-dimensional diffraction grating structure for what is termed a matrix of holographic lenses. This may be provided by a step and repeat technique (FIG. 5) or by simultaneous recording (FIG. 6), because of the lengthy and delicate character of the former type of recording. It is evident, however, that the simultaneous process disclosed also has severe deficiencies, since it is prepared by using a diffraction pattern comprising a matrix of openings of preselected size and pitch. Furthermore, while the pitch must be small the size must be very small, in order to obtain a suitable diffraction characteristic. Consequently, the matrix must itself be very precisely prepared, using repeating techniques that approach the limits of feasibility. Even so, the system remains subject to the limitations and problems previously mentioned, because the minute matrix openings create high sensitivity to dust, size variations and other effects, because available light is used with low efficiency, and because only divergent beams can be generated so that other optics are needed for most practical applications.

SUMMARY OF THE INVENTION

The present invention relates to novel lens array holograms suitable for functioning as fly's eye lenses and methods for making such holograms. The holograms themselves comprise areal, spatially disposed interference patterns between coherent light beams, one of which represents the images of converging lenses defined by a refractive precursor unit having size, shape, spacing and optical characteristics differing from those sought in the holographic lens array, which itself is of high density and optical efficiency.

Methods of forming holograms in accordance with the invention illuminate a refractive multiple element lens precursor unit, of one-dimensional or two-dimensional form, with an object beam of coherent light to provide corresponding converging beamlets which are collimated and mutually intersect in an intermediate plane in which beam size and shape are selectively controlled, then focused as controlled beams toward a rear image focal plane, prior to which the interference pattern between the beams and a coherent reference beam is recorded. It is particularly advantageous to dispose the precursor array in a controllable refractivity medium, to substantially increase the effective focal length of the lenslets and to utilize a high proportion of their area in making the recording. In accordance with the methods of the invention, lenslet characteristics may be selectively defined in terms of $f$- numbers, size, shape and spacing, and all the lenslets of a one-dimensional or two-dimensional array may be recorded simultaneously. It is further feasible to introduce added phase randomization into individual lenslets, and this is of greater desirability where a medium is used to increase the precursor lenslet focal length. In addition, intensity gradients across a coherent beam may be equalized for a given system by recording a compensatory variation in the holographic lens array. Using methods in accordance with the invention, high density holographic lens arrays may readily be prepared in which each lenslet equivalent has high optical efficiency, a high signal-to-noise ratio and provides an initially converging beamlet of long $f$-number, e.g. $f/20$ or more.

DETAILED DESCRIPTION OF THE DRAWINGS

A better understanding of the invention may be had by reference to the following description, taken in conjunction with the accompanying drawings, in which:

FIG. 1 is a schematic representation of a system for providing novel holograms in accordance with the invention;

FIG. 2 is a schematic representation of a system utilizing a holographic lens array in accordance with the invention for data recording;

FIG. 3 is a plan view, not drawn to scale, of the elements of an optical system for making a one-dimensional holographic lens array in accordance with the invention;

FIG. 4 is a side view of the arrangement of FIG. 3 with certain of the elements omitted for simplicity.

DETAILED DESCRIPTION OF THE INVENTION

Figure 5:
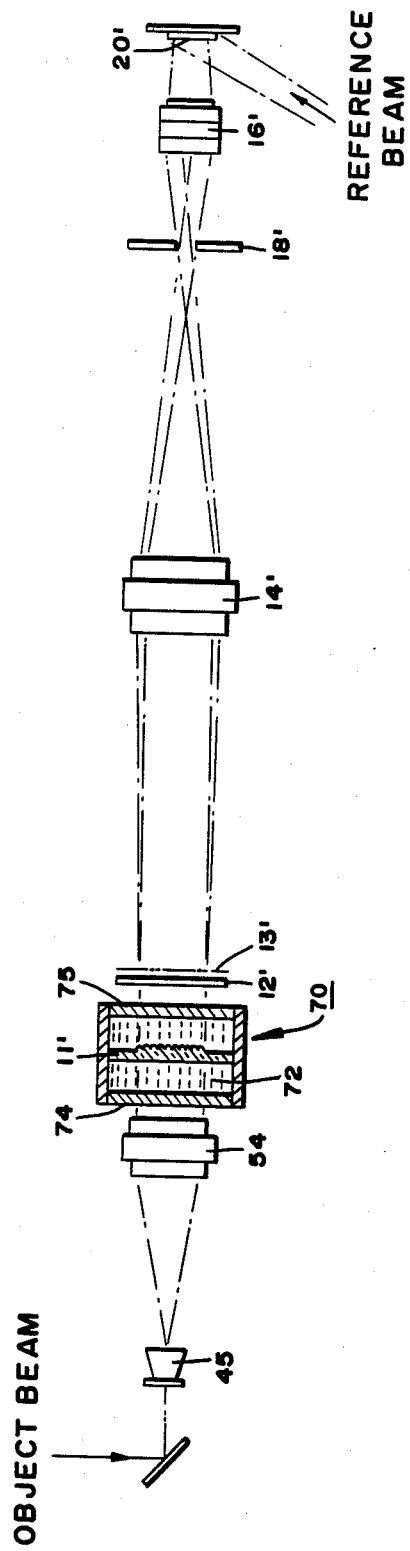
FIG. 5 is a simplified schematic representation, not to scale, of a different optical system for making a holographic lens array in accordance with the invention.

Apparatus and a method for making a holographic lens array are depicted in the schematic representation of FIG. 1. Collimated coherent light from a source (not shown) is directed through a graded mask 10 onto a commercially available fly's eye lens array 11, the elements of which are shown greatly exaggerated, that serves as a precursor array for the system. Embossed plastic refractive lenses that may be used for this purpose are sold by Aeroflex, Inc., an available model used here being a 53 × 53 element array of lenses with F/3 focal ratios and 0.043 inch (approximately 1.2 mm) spacing between lenses. The $f$-number is much smaller than needed for the F/25 ratio desired for optimum efficiency in a specific typical application. The graded mask 10 provides an optional but very useful feature. The mask 10 has areal intensity variations which compensate for nonuniform illumination characteristics in a data recording system with which the holographic lens array is to be used, and nonuniform illumination by the coherent light beam when the holographic lens array is made.

The individual lens elements in the lens array 11 are considerably exaggerated for clarity in FIG. 1, but provide a focused array of converging beamlets appearing as point sources in a plane P and which then diverge as individual beamlets along axes parallel to a central optical axis. With lenses of low $f$-number, it will be appreciated that the beams may diverge substantially more than shown in FIG. 1. Prior to the plane P, the beamlets are directed through a random phase mask 12, then a pinhole mask 13 in which the holes are aligned with the beamlets from the lens array 11. The random phase mask 12 may incorporate incremental or randomly varying phase characteristics for phase modulation of the impinging beamlets in essentially random manner. The pinhole mask 13 has apertures aligned with the focal points of the beamlets and serves to limit light scattering between beamlets. It will be appreciated by those skilled in the art that the lens array 11 and the pinhole mask 13 need not be used concurrently. Because of greater light efficiency and for minimizing the effects of dust, pits, bubbles and the like it is preferred to use as much of the areas of the lenslets in the array 11 as feasible, to minimize the proportional effects of the imperfections. Treating the available illumination as the signal and attenuation introduced by the imperfections as the noise, it is desirable that all elements of the array have a suitably high signal-to-noise ratio.

The focused beamlets in the array focal plane P are reimaged by a pair of lenses 14, 16 in a spaced apart rear image plane along the axis. The first lens 14 has a focal length $f_1$ and is positioned so that the front focal plane of the first lens 14 lies at the array focal plane P and its rear focal plane is coincident with the front focal plane of the second lens 16. Thus all of the beamlets are superimposed in the coincident focal planes, where beam size and shape are defined by a selected aperture 18. The point sources in the image plane can be made rectangular or circular in cross section depending upon the aperture shape, with selected spacings between the points focused in the rear image plane being established by the ratio of the focal lengths of the two lenses 14, 16 and the spacing of the precursor elements. Dependent upon the $f$-number of the lenslets in the array 11, the beam cross-sectional areas impinging on the aperture 18 may be substantially greater than are shown in FIG. 1.

It will be noted that the rear image plane for the reimaged array of point sources nominally coincides with the rear focal plane of the second lens 16. The various elements, including the beam shaping aperture 18 and the rear image planes need not be precisely in the focal planes of the lenses 14 and 16. It will be understood that the lenses and the various elements may be shifted slightly so as to change the effective lens magnifications correspondingly, without affecting the operation of the system. A holographic lens array is recorded on a record member 20 disposed between the second lens 16 and the rear image plane when the record member 20 is illuminated with a reference beam. The reference beam is provided by using an angled beam splitter 21 in the path of the incident light, with angled mirrors 22, 23 for defining the reference beam path. The hologram pattern defines a holographic lens array that is a function of the optically transformed image patterns of the superposed individual lenslets of the fly's eye lens 12 as well as the interference pattern between the object and reference beam. Furthermore, the lenslets of the array 11 use a substantial proportion of the light available, both within the cross-sectional areas of each lenslet and within the object beam cross-section. The resultant areal recordings provide lens equivalents of high light transmission effectivity.

The hologram on the record member 20 can now be used, as described below in conjunction with FIG. 2, as a holographic lens array having high efficiency, lenslets of long focal lengths with apertures that are arbitrarily sized and shaped, and with selected spacings between lens elements. It is preferred to employ a bleached hologram, utilizing the phase modulation instead of intensity modulation inherent therein to give substantially higher light efficiency. It is also comprehended to utilize extremely high efficiency photopolymer elements as record members.

The areal distribution of illumination on the hologram may contain either compensation for cross sectional intensity gradients in the impinging light beam, or precompensation for nonuniform illumination in a data recording system, or both. This characteristic is achieved by the presence of the graded mask 10 in the system. In addition, the characteristics of the random phase mask 12 are imparted optically to the hologram, reducing peak intensity variations in the recorded data hologram by orders of magnitude.

FIG. 2 depicts in schematic form a generalized system for data recording utilizing the holographic lens array 20. An illumination beam is directed off a mirror 24 so as to be incident on the holographic lens array at an angle corresponding to the Bragg angle. The zero order beam transmitted through the holographic lens array 20 thus obliquely intersects the principal optical axis of the system, which may be visualized as a central axis normal to the holographic lens array 20. The zero order beam then is absorbed in a suitable non-reflecting structure (not shown) or otherwise isolated from the system, as by a knife edge interceptor element 25. The first order beam is diffracted by the array 20 along the direction of the central axis, and the diffraction pattern defines a plurality of converging beamlets of long focal length focusing at an array focal plane spaced apart from the holographic lens array 20 by a distance equal to its effective focal length. The digital data presented by a pattern of incremental areas of varying light transmissivity on a data film 26 positioned in front of the array focal plane independently modulates each of the converging beamlets from the holographic lens array 20 in accordance with the data to be recorded. Alternatively, the data film 26 may be used behind the array focal plane in the diverging beam region. A pinhole mask 28 may be positioned in the array focal plane adjacent the data film 26 to minimize scattered and unwanted light in the system. It will be appreciated that beam size has been exaggerated for clarity and that many more beamlets are used in a practical system. It is generally preferable that the beamlets from the holographic lens array 20 substantially encompass the incremental areas on the data film 26 or any light valve arrangement that is used to generate the desired recording pattern. By utilizing all of the cross sectional area of the valve aperture, the effects of local defects and irregularities in the valve are minimized. System design can often be simplified, by using the holographic lens array, which provides finely defined beamlets at suitable working distances without the introduction of other optical elements.

The individual diverging beams from the data modulated point sources at the array focal plane are at least partially superimposed by a recording lens system comprising a pair of lenses 30, 32 and directed onto a record member 34 that is to comprise a data microhologram. The microhologram is also illuminated by a coherent reference beam in conventional fashion.

It will be apparent to those skilled in the art that the holographic lens array 20 comprises the optically transformed equivalent of a fly's eye lens having particularly advantageous attributes. The system has high light efficiency, because a very high proportion of the incident light is used to form the individual beamlets whose intensities are modulated by the data sources. At the same time, minor imperfections in or on the lenslets do not appreciably affect the corresponding hologram, a factor of great significance because each of a large number (e.g. 2500) of holograms must meet minimum high standards for reliability. Furthermore, the spacings of the lenslets can be matched precisely to those of the data source, whether data film, or bistate modulators of other types are used. In addition, the $f$- number of the lenslets may be matched to the system, optimizing light efficiency. The light in the converging beamlets directed on the data modulator is precisely focused, so that scattered light effects are small, and the contrast ratio between data points and the surrounding area is very large. Because the light modulators pass a relatively large beam, data beam blockage is unlikely and data point intensity is uniform. A practical example of a holographic lens array in accordance with the invention, prepared from the previously mentioned precursor array, contains 50 × 50 elements having 0.25 mm center to center spacings and approximately 2.93 mm$^2$ areas. This holographic lens array may conveniently be mounted and used relative to a light valve array, without further optical elements.

It should additionally be noted that the phase randomization inherent in the initial commercially available precursor lens array, arising from small nonuniformities in fabrication, is carried over into the holographic lens array to give characteristics equivalent to those described in previously referenced U.S. Pat. No. 3,716,287. This phase randomization is significantly supplemented by the recording variations in the hologram that are introduced by the random phase mask 12 of FIG. 1. In addition, variations in illumination across the coherent light beam are either equalized or precompensatd by the variations introduced by the graded mask 10 in FIG. 1.

The system schematically depicted in FIG. 1 for the recording of the holographic lens array is illustrative of one of the more complex holographic lens forms that can be provided, i.e. a two-dimensional rectangular array generated in a single exposure. Some holographic data recorders, of course, use one-dimensional data blocks and lens arrays. In accordance with the invention, a one-dimensional holographic lens array is realized in a specific exemplary system as depicted below in the plan view of FIG. 3 and the side view of FIG. 4.

In the example of FIGS. 3 and 4, the sharply focused beam from a laser 40 is directed off a pair of mirrors 42, 43 along a principal central axis for the system. A divergent beam is formed by a lens 45, expanding the beam to a selected cross-sectional area before it is transmitted through a collimating lens 47. A linear array of refractive lenslets 50 is disposed vertically transverse to the central axis providing a linear array of point sources at a lens array focal point. A linear pinhole mask 52 having pinholes with the same center-to-center spacing (0.043 inch in this example) as the lenslet array is positioned at or very close to the lens array focal plane to minimize light scattering from the lenslets. The vertically disposed series of converging beamlets passes through the mask 52 and each beamlet diverges (best seen in FIG. 4) toward a first lens 54. Adjacent the collimating lens 47 and to one side of the central axis, slanted mirrors 56, 57 direct a small portion of the laser beam into a path parallel to the central axis to form a reference beam for subsequent recording (seen in FIG. 3 only).

In this example of a practical system, the first lens has an $f/6$ focal ratio, and a 24 inch focal length, so that the front and rear focal planes are approximately 24 inches from the lens center. The lens array focal plane is adjacent the front focal plane and an aperture 60 is disposed in the rear focal plane of the lens 54. The beamlets are collimated and superposed at the aperture 60 by the lens 54. The aperture 60 in this example is a rectangular opening of 1.1 inch × .12 inch, the longer dimension being in the horizontal direction to provide a holographic lens array. The shaped rectangular beam diverging along the central axis from the aperture 60 passes through a second lens 62, focusing the beamlets along the axis toward points at the rear image plane. The specific lens 62 used was a 12 inch focal length lens having an $f/2.5$ focal ratio.

In the path of the reference beam, an angled mirror 64 is disposed to intercept the reference beam and to direct it at an intersecting angle relative to the central axis so as to be superimposed upon a record member 66 disposed in the path of both beams in a record plane before the rear image plane. The system is arranged in this case to image the point sources in the rear image plane on 0.0214 inch centers. Upon development, the resultant diffraction pattern consitutes the holographic lens array.

A number of particular advantages can be obtained in both holograms and methods in accordance with the invention by utilizing the arrangement of FIG. 5, in which the elements are given the same numerical designations as corresponding elements previously described, but in which the parts are not intended to be drawn to scale, and those portions of the optical system concerned with the direction of the object beam and reference beam have been omitted for simplicity.

In FIG. 5, the object beam is directed toward a lens 45 to form a divergent beam which is passed through a collimating lens and directed onto and through a transparent holder 70 in which the precursor lens array 11' is disposed. The individual beamlets from the precursor lens array 11' are directed through a random phase plate 12' and a pinhole mask 13' into reducing optics in which a first lens 14' superimposes the beamlets at a beam shaping aperture 18', from which they diverge onto a second lens 16' to be redirected in a convergent mode onto the record member 20'. The record member 20' is concurrently illuminated by a reference beam, which may be diverging as shown but also may be converging or collimated. In this system, the first lens 14' has a 24 inch focal length and an $f/6$ focal ratio, and the second lens 16' has a 135 mm focal length and an $f/4.5$ focal ratio. The beam shaping aperture 18' has a square shape of 0.25 × 0.25 inches, with slightly rounded corners to minimize diffraction effects. The ratio of the size of this aperture 18' to the $f$- number of the second lens 16' determines the $f$- number of the recorded holographic lenses, which is here $f/25$.

In the system of FIG. 5, the precursor lens array 11' is immersed in a controllable refractivity solution 72. It has been found convenient to utilize a sugar solution, the sugar concentration of which may readily be adjusted, to give an adjustable index of refraction that is intermediate that of the lens array 11' and air. This partial matching of the refractive index of the plastic effectively increases the focal length of the precursor lens array 11' directly at the refractive lenses, so that the focal length is increased and the beam convergence angle is decreased. Little light is lost in the holder 70 because transparent faces 74, 75 are utilized on the sides on which the beam impinges, and the sugar solution 72 has relatively high transmissivity. As the index of refraction of the sugar solution is changed, the position of the first lens 14' may have to be responsively changed in order that its rear focal plane be properly positioned relative to the lens array 11' focal plane, and the remaining elements may also have to be adjusted.

With this arrangement, the patterns of the individual beamlets that are superimposed by the first lens 14' at the beam shaping aperture 18' can provide a minimum of excess beam pattern. Therefore, the great majority of the useful area of each lens in the array 11' is used in concentrating the light into the beam that is directed through the aperture 18'. Consequently, normal amounts of dust or dirt on the small elements of the array, pits in the surface or bubbles in the interior of the array do not significantly reduce the signal-to-noise ratio in the recorded holographic pattern. The effects of such aberrations are averaged out by the remaining lens area, and the presence of the refractive fluid renders the beams much more uniform while at the same time increasing the light efficiency. There is, however, some reduction of the phase differential between the different lenslets in the array, so that it is particularly useful to compensate for this effect by the employment of the random phase shift plate 12'.

Holographic lens arrays in accordance with the invention have small center-to-center spacings of generally less than 5 mm between lenses, and more typically of less than 1 mm, with focal numbers in excess of $f/10$ and advantageously in excess of $f/20$. The holographic lenses are nonetheless relatively large in area, and at least adjacent lens areas are at least partially superposed.

While a number of modifications and variations have been described or suggested it will be appreciated that the invention encompasses all aspects falling within the scope of the appended claims.

What is claimed is:

1. A novel hologram providing a holographic lens array prepared by the method of projecting coherent light through a refractive fly's eye lens array to provide a number of lens images on a record member along with a reference beam to simultaneously record a number of interference patterns, comprising a record member having a light beam modulating recorded interference pattern including a plurality of like areal and spatially disposed optically transformed representations of the individual lens images having given focal lengths and predetermined spacings defining an array of holographic lenses, the area of each lens is sufficiently large to minimize diffractive effects and provide a substantial signal-to-noise ratio.

2. The invention as set forth in claim 1 above, wherein the holographic lenses each provide initially converging light beams when illuminated, and wherein the holographic lenses have relative phase differences between them.

3. The invention as set forth in claim 2 above, wherein the F- number of the holographic lenses is in excess of approximately $f/10$ and wherein the center-to-center spacings of the lenses are less than approximately 5 mm.

4. The invention as set forth in claim 3 above, wherein the F- number of the holographic lenses is in excess of $f/20$, the lenses are at least partially superposed, the center-to-center spacing is less than approximately 1 mm.

5. The method of making a holographic lens array having lenslets of selectable F- number characteristics and a selectable array disposition from a precursor refractive lens array comprising the steps of:
generating at least one coherent light beam;
illuminating a precursor refractive lens array having lenses with arbitrary spacings and relatively short focal lengths relative to the desired final characteristics to simultaneously image the at least one light beam in a rear image plane as a plurality of spatially disposed converging beamlets;

optically transforming the images presented by the precursor array to selected F-number, size, shape and spacing before the rear image plane; and recording a hologram adjacent but spaced apart from the rear image plane to provide areal and spatially disposed lens image representations which have predetermined spacings and longer focal lengths than the lenses of the precursor array.

6. The method as set forth in claim 5 above, further including the step of concurrently substantially extending the focal length of the converging beamlets from the refractive lens array, thereafter superimposing the images presented by the precursor array, and shaping the superimposed images such that a substantial majority of the light through each lens in the precursor array is utilized in the subsequently recorded hologram.

7. The method as set forth in claim 6 above, wherein the step of extending the focal length comprises surrounding at least the broad faces of the precursor lens array with a light refractive medium having a refractive index intermediate that of air and the precursor lens array.

8. The method as set forth in claim 7 above, wherein the step of extending the focal length comprises using a transparent solution containing selectable proportions of solids to vary the refractive index.

9. The method as set forth in claim 8 above, wherein the solution comprises a sugar-containing solution.

10. The method as set forth in claim 5 above, wherein the recording partially superposes adjacent lens image representations.

11. The method of preparing, on a record member, a high density holographic lens array having long focal length lenslet equivalents at selected spacings from a precursor array of individual refractive lenses with arbitrary spacings and relatively short focal lengths comprising the steps of:

directing an object beam of coherent light along an axis onto the precursor array to provide a plurality of converging beamlets focusing at an array focal plane and beamlets diverging therefrom;

focusing the diverging beamlets at an intermediate focal plane spaced from the array focal plane by a selected first focal distance;

shaping the focused beamlets to a selected cross sectional beam configuration at an intermediate focal plane;

imaging the shaped beam at the intermediate focal plane onto a rear focal plane spaced apart by a selected second focal distance, a substantial majority of the light available in the beamlets being used within the image;

illuminating, with the shaped imaging beam, a record member adjacent to but spaced apart from the rear local plane such that an areal representation of each lens is recorded on the record member; and also illuminating the record member with a reference beam coherent with the object beam to form a hologram thereon.

12. The method as set forth in claim 11 above, wherein the first and second focal distances are selected to determine the effective focal length of the lenses of the holographic lens array, and wherein the $f$-number of the lenses of the holographic lens array is in excess of $f/10$ and the center-to-center spacing is less than 5 mm.

* * * * *